United States Patent
Horiguchi

(10) Patent No.: US 10,066,973 B2
(45) Date of Patent: Sep. 4, 2018

(54) BRILLOUIN SCATTERING MEASUREMENT METHOD AND BRILLOUIN SCATTERING MEASUREMENT SYSTEM

(71) Applicant: NEUBREX CO., LTD., Kobe-shi, Hyogo (JP)

(72) Inventor: Tsuneo Horiguchi, Tokyo (JP)

(73) Assignee: NEUBREX CO., LTD., Kobe-Shi, Hyogo (JP)

( * ) Notice: Subject to any disclaimer, the term of this patent is extended or adjusted under 35 U.S.C. 154(b) by 139 days.

(21) Appl. No.: 15/337,476

(22) Filed: Oct. 28, 2016

(65) Prior Publication Data
US 2017/0248448 A1 Aug. 31, 2017

(30) Foreign Application Priority Data
Feb. 29, 2016 (JP) .................................. 2016-036685

(51) Int. Cl.
*G01D 5/353* (2006.01)
*H01S 5/12* (2006.01)
*H01S 5/00* (2006.01)
*G02B 27/28* (2006.01)

(52) U.S. Cl.
CPC ....... *G01D 5/35364* (2013.01); *G02B 27/283* (2013.01); *H01S 5/0071* (2013.01); *H01S 5/0085* (2013.01); *H01S 5/12* (2013.01)

(58) Field of Classification Search
USPC ..... 250/227.14, 227.23, 227.24; 385/15, 27; 356/73.1
See application file for complete search history.

(56) References Cited

U.S. PATENT DOCUMENTS

| | | | |
|---|---|---|---|
| 7,170,590 B2 * | 1/2007 | Kishida | G01B 11/16 250/227.14 |
| 2016/0025524 A1 * | 1/2016 | Nikles | G01K 11/32 356/73.1 |

FOREIGN PATENT DOCUMENTS

JP 5493089 B2 5/2014

OTHER PUBLICATIONS

Nishiguchi, K. et.al, "Synthetic Approach for Brillouin Optical Time-Domain Reflectometry", Proceedings of the 42nd ISCIE International Symposium on Stochastic Systems Theory and Its Applications, pp. 81-88, (SSS' 10), Nov. 26-27, 2010.

(Continued)

*Primary Examiner* — Kevin Pyo
(74) *Attorney, Agent, or Firm* — Buchanan Ingersoll & Rooney PC

(57) ABSTRACT

A Brillouin backscattered spectrum is obtained in such a way that two optical pulse pairs each composed of two pulses of different durations and of the same phase and Π phase difference are launched into a sensing optical fiber; Brillouin backscattered lights produced by the optical pulse pairs are detected into signals for the respective optical pulse pairs; the signals are sampled with two window functions whose time widths are equal to respective pulse durations of the optical pulse pair and whose delay time is variable; each sampled signal is transformed with a predetermined transformation; products of the transformed signals are calculated; and subtraction between the products is performed.

12 Claims, 13 Drawing Sheets

(56) References Cited

OTHER PUBLICATIONS

Koyamada, Y. et al., "Novel Technique to Improve Spatial Resolution in Brillouin Optical Time-Domain Reflectometry", IEEE Photonics Technology Letters, vol. 19, No. 23, pp. 1910-1912, Dec. 1, 2007.

Shibata, R. et.al, "High Spatial Resolution BOTDR Based on FFT", Proceedings of 56th Meeting on Lightwave Sensing Technology, pp. 133-139, Dec. 2015.

* cited by examiner

BRILLOUIN SCATTERING MEASUREMENT METHOD AND BRILLOUIN SCATTERING MEASUREMENT SYSTEM

BACKGROUND OF THE INVENTION

Technical Field

The present invention relates to fiber optic sensor technologies that utilize dependency of the frequency shift in stimulated and spontaneous Brillouin scattering on strain and/or temperature, and particularly to a Brillouin scattering measurement method and a Brillouin scattering measurement system that utilize Brillouin backscattered light obtained by launching an optical pulse into one end of an optical fiber.

Description of the Related Art

Conventionally, two main kinds of measurement techniques have been proposed and/or demonstrated for improvement in accuracy, particularly, in spatial resolution in distributed strain measurement and/or distributed temperature measurement with an optical fiber. One technique performs the measurement using both end of an optical fiber and is referred to as "Brillouin optical time-domain analysis" (BOTDA) that performs time-domain measurement or as "Brillouin optical correlation-domain analysis" (BOCDA) that performs correlation domain measurement. The former includes a measurement technique referred to as "phase shift pulse Brillouin optical time-domain analysis" (PSP-BOTDA) that obtains a high gain but reaches only sub-meter spatial resolution. The latter includes a measurement technique that is superior to the former because of a millimeter-order spatial resolution; however, the technique is typically applied only to a limited range measurement and needs a delay line fiber of more than twice as long as the measuring optical fiber.

In contrast to the above, there has been another measurement technique referred to as "Brillouin optical time-domain reflectometry" (BOTDR), which uses the Brillouin backscattered light extracted by launching an optical pulse into only one end of an optical fiber. This technique, in principle, detects physical quantity such as strain from change in the frequency shift of a Brillouin scattered light and a position from the light round-trip time between the launch point and a scattering point. However, there have been few conventional reports on BOTDR that demonstrate high spatial resolution, in particular, for a case of long measurement range. Furthermore, in BOTDR, due to the uncertainty relation, it is indicated that there is a limitation on simultaneous enhancement of the spatial resolution and the frequency resolution in a single measurement; hence it is said that combination of a plurality of measurements is necessary (see K. Nishiguchi et al., "Synthetic approach for Brillouin optical time-domain reflectometry", 42nd ISCIE International Symposium on Stochastic Systems Theory and Its Applications (SSS'10), 2010, pp. 81-88).

Representative measurements that achieved enhancement of spatial resolution by BOTDR include the following two examples. A first example is referred to as "double-pulse Brillouin optical time-domain reflectometry" (DP-BOTDR) (see Y. Koyamada, et al., "Novel Technique to Improve Spatial Resolution in Brillouin Optical Time-Domain Reflectometry", IEEE PHOTONICS TECHNOLOGY LETTERS, VOL. 19, NO. 23, Dec. 1, 2007). A second example is referred to as "synthetic Brillouin optical time-domain reflectometry" (S-BOTDR) (see JP5,493,089 B2), which is a technique that combines a plurality of measurements and synthesizes the spectra obtained by the measurements in order to overcome the limitation due to the uncertainty relation.

The first example demonstrated a high spatial resolution for the first time. The example used two short optical pulses as a probe. Specifically, two short pulses having comparable durations were launched into an optical fiber with an interval of approximately 10 ns, and produced Brillouin backscattered signals were passed through a filter matched to an envelope of the two pulses, whereby a spatial resolution of 20 cm was demonstrated.

The second example used as an optical pulse probe a combination of long duration and small amplitude pulses and a short duration and large amplitude pulse. Specifically, by generating four types of probes combined with the large amplitude and short duration pulse and the small amplitude and long duration pulses modulated in a quadri-phase shift keying, an excellent spatial resolution of 10 cm was demonstrated in a measurement range over several tens of kilometers.

However, in the DP-BOTDR measurement disclosed by Y. Koyamada, et al., since the Brillouin frequency shift was evaluated on the basis of an envelope of the two pulses having a single phase and comparable durations, the evaluated frequency shift contained a large error; hence it is difficult to determine the true frequency shift. In contrast, in the S-BOTDR measurement, although a Brillouin frequency shift can be evaluated without error since the true value of the frequency shift is theoretically calculated, the Brillouin frequency shift needs to be evaluated by synthesizing the detected signals using four types of phase modulations; hence the S-BOTDR measurement system is complicated and takes time in measuring the true value.

The present invention is made in light of the above described problems and aimed at providing a Brillouin scattering measurement method and a Brillouin scattering measurement system that are capable of achieving, more conveniently than using a S-BOTDR, an excellent spatial resolution in a long range measurement, by utilizing a BOTDR that uses two types of optical probes respectively composed of short pulses and adjacent long pulses with bi-phase and zero-phase modulations and uses cross-correlations between signals sampled with window functions of narrow and wide widths from signals detected from Brillouin backscattered lights produced by the probes.

SUMMARY OF THE INVENTION

A Brillouin scattering measurement method according to the present invention for for measuring a physical quantity from frequency shift variation of a Brillouin backscattered light, includes generating two types of optical pulse pairs each composed of two pulses of different durations, one of the pairs having pulses of the same phase and the other pair having pluses of different phases; detecting, with an optical heterodyne receiver, Brillouin backscattered lights respectively produced by launching the generated two types of optical pulse pairs into one end of an optical fiber; sampling the signals detected by the optical heterodyne receiver, with two window functions whose time widths are equal to respective pulse durations of the optical pulse pairs and whose delay time is variable; transforming the respective signals sampled with the two window functions, with a predetermined transformation; calculating products of the two signals, which respectively correspond to the two types of optical pulse pairs, transformed with the predetermined transformation; and subtracting the calculated products from each other, thereby to obtain a spectrum of the Brillouin scattered light.

A Brillouin scattering measurement system according to the present invention for measuring a physical quantity from frequency shift variation of a Brillouin backscattered light, includes a light source, or a first light source and a second light source different from the first light source; a pulse modulator for modulating a light emitted from the light source or any one of the two light sources to an optical pulse pair each composed of two pulses having different durations; a pulse phase modulator for modulating the optical pulse pairs modulated by the pulse modulator to two types of optical pulse pairs, one of the optical pulse pairs having the pulses of the same phase and the other pair having the pulses of different phases; a first optical coupler for receiving the two types of optical pulse pairs to launch the received optical pulse pairs into one end of an optical fiber through an input path of the coupler and for receiving Brillouin backscattered lights produced in the optical fiber, to output the backscattered lights through a path different from the input path; a second optical coupler for receiving the Brillouin backscattered lights output from the first optical fiber along with the light emitted from the light source or a light emitted from the other of the first or the second light sources, to output the two kinds of lights individually; a balanced photodiode for individually receiving the two kinds of lights output from the second optical coupler, to output one kind of signals after adjusting balance of the input signals; and a signal processor for processing the signal output from the balanced photodiode, wherein the signals of the Brillouin backscattered lights produced by the two types of optical pulse pairs are individually processed with the signal processor in such a way that the signals received by the balanced photodiode are sampled with two window functions whose time widths are equal to the respective durations of the pulses of the optical pulse pairs and whose delay time is variable; and the two windowed signals are transformed with a predetermined transformation; and the transformed signals, which respectively correspond to the two types of optical pulse pairs, are multiplied by each other; and then the calculated products are subtracted from each other, thereby to obtain a spectrum of the Brillouin backscattered light.

ADVANTAGEOUS EFFECT OF THE INVENTION

According to the present invention, in a BOTDR measurement of Brillouin backscattered light extracted by launching optical pulse pairs into only one end of an optical fiber, a Brillouin scattering measurement method and a Brillouin scattering measurement system can be provided that are capable of achieving, more conveniently than using a conventional method, an excellent spatial resolution of approximately 20 cm in a long measurement range over several kms.

DETAILED DESCRIPTION OF THE INVENTION

Embodiment 1

Figure 1A:
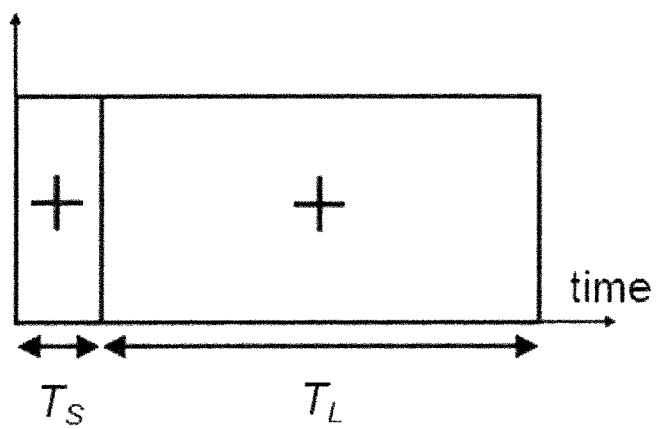
FIGS. 1A and 1B show electric signal waveforms of optical pulse pairs used in a Brillouin scattering measurement method and a Brillouin scattering measurement system according to Embodiment 1 of the present invention.
Figure 1B:
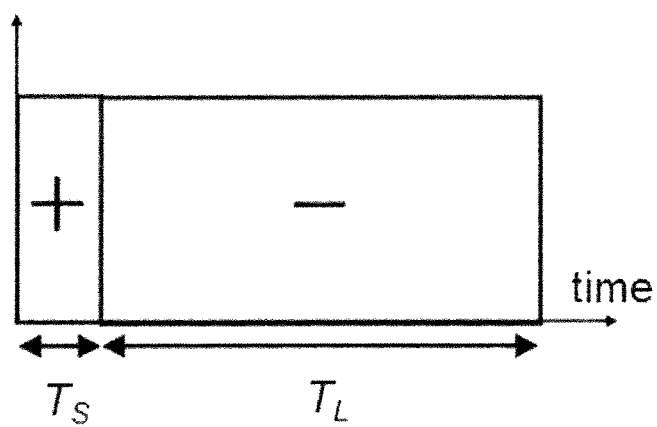

A Brillouin scattering measurement system and a Brillouin scattering measurement method according to Embodiment 1 of the present invention will be described hereinafter with reference to the drawings. FIGS. 1A and 1B shows electric signal waveforms of optical pulse probes used in the Brillouin scattering measurement system, in which the vertical axis represents the levels of the optical pulse probes and the horizontal axis represents time. The pulse probes each are composed of a short optical pulse and an adjacent long optical pulse. These pulses have durations $T_s$ and $T_L$ ($T_s<T_L$), respectively. Note that the symbol "++" in FIG. 1A means that the pulses have the same phase in the sections of the durations $T_s$ and $T_L$, i.e., FIG. 1A is schematic diagram of the phase modulation of zero phase shift. The pulse probe with zero phase modulation is hereinafter referred to as "optical pulse pair A". And the symbol "+−" in FIG. 1B means that the pulses have a phases difference by Π (180 degrees) in the sections of the durations $T_s$ and $T_L$, i.e., FIG. 1B is schematic diagram of the phase modulation of Π phase shift. The pulse probe with Π phase modulation is hereinafter referred to as "optical pulse pair B".

In the Brillouin scattering measurement system of Embodiment 1, spatial resolution and Brillouin spectrum width are determined by the pulse durations $T_s$ and $T_L$, which will be understood in the later description. It should be understood that the spectrum here represents intensity of a signal at each frequency. Brillouin backscattered lights produced by the pulse probes are extracted as a baseband signals through an optical heterodyne detection and frequency conversion by a shift frequency $f_M$.

In the BOTDR, a spatial resolution $\Delta z$ by a single optical pulse is generally expressed as the following equation (1):

$$\Delta z = \frac{t_L \cdot V_g}{2}, \tag{1}$$

where $t_L$ is the duration of an optical pulse and $V_g$ is the light velocity in an optical fiber. Since the velocity $V_g$ is a physical property value inherent to an optical fiber used, it is necessary to use an optical pulse having a short duration $t_L$ to enhance the spatial resolution.

Moreover, in the BOTDR, since the Brillouin backscattered light produced by the optical pulse is necessary to be frequency-converted, a frequency resolution $\Delta f$ needs to be high and is expressed by the following equation (2):

$$\Delta f \cong \sqrt{\Delta f_b^2 + \left(\frac{1}{T_L}\right)^2}, \tag{2}$$

where $\Delta f_b$ is a spectrum width called natural linewidth, i.e., a Lorentzian spectrum linewidth depending on the optical fiber used. A Brillouin spectrum obtained by the measurement method or the measurement system according to Embodiment 1 is approximated by convolution (superimposing a function G on a function F while translating F) of the Lorentzian spectrum and the Fourier transform of the long pulse. Furthermore, the spectrum width is approximated by square root of the sum of square of the Lorentzian spectrum and the peak width of the Fourier transformed long pulse. An equation obtained by this approximation is the above equation (2).

Using the short optical pulse brings high spatial resolution but low frequency resolution. On the other hand, using long optical pulse brings high frequency resolution but low spatial resolution.

Hence, in Embodiment 1, optical pulse pairs each composed of a short duration pulse and a long duration pulse are generated to simultaneously enhance the spatial resolution and the frequency resolution by interaction of the two types of optical pulses. In order to achieve a high spatial resolution and a high frequency resolution by interaction of the two types of optical pulses, it is necessary that the short pulse and the long pulse be not temporally overlap with each other nor be separate from each other by more than a proper interval. Specifically, by taking account of the phonon lifetime, a maximum interval between fall of the short pulse and rise of the long pulse is set to be zero or less than 30 ns, preferably less than 10 ns. It should be noted that the relationship between the durations of the short pulse and the long pulse is not limited to $T_S < T_L$, but may be $T_S \geq T_L$.

Figure 2:
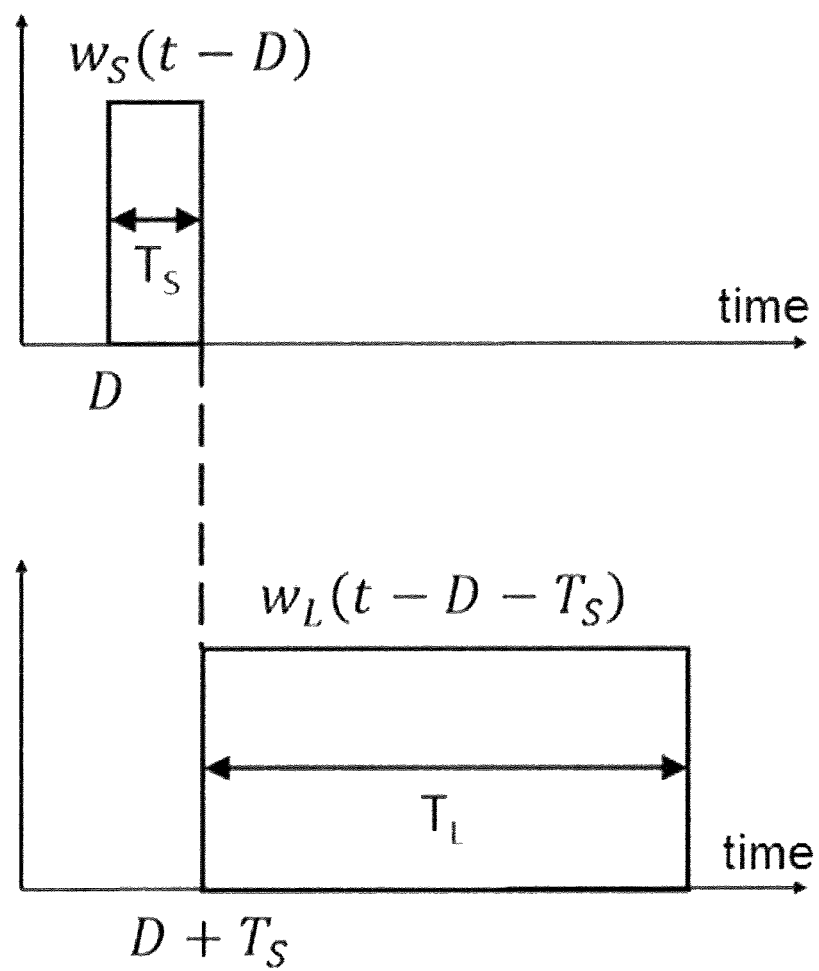
FIG. 2 is a diagram showing two types of window functions used in the Brillouin scattering measurement method and the Brillouin scattering measurement system according to Embodiment 1.

Considering the above resolution enhancement, a portion of the signal is extracted using two rectangular window functions $W_S(t)$ and $W_L(t)$ shown in FIG. 2, where t is a parameter representing time. The time widths of the window functions are the same as the durations of the above pulses: $T_S$ and $T_L$, respectively. As shown in FIG. 2, portions of the signals are extracted using the window function $W_S(t-D)$ that is delayed from $W_S(t)$ by a time D and the window function $W_L(t-D-T_S)$ that is delayed from $W_L(t)$ by a time $D+T_S$, where D is a delay from the launching time of the pulse probe. In the case of using the two types of window functions, the data sampled with the window functions includes a Brillouin backscattered signal from a short section SS ranging from $z=V_g*D/2$ to $z=V_g*(D+T_S)/2$ and a Brillouin backscattered signal from a long section LS ranging from $z=V_g*(D+T_S)/2$ to $z=V_g*(D+T_S+T_L)/2$, where z represents distance.

Note that while in the above description on the window functions shown in FIG. 2, it is assumed that the respective short and long pulses of the optical pulse pair A and the optical pulse pair B are adjacent to each other, the interval between these pulses is not limited to this. The window functions can be also used for the case where the short pulse and the long pulse, which form the optical pulse pairs, are separated. Note that when the short pulse and the long pulse are separated, it is necessary to use the window functions $W_S(t-D)$ and $W_L(t-D-T_S)$ separated by the same interval as that between the two optical pulses.

However, only extracting the data using the above described window functions does not allow high spatial resolution measurement and precise Brillouin frequency shift measurement. Hence, by combining subtraction of measurement results obtained using the two pulse probes: the optical pulse pair A and the optical pulse pair B modulated in binary phase shift keying and a cross correlation of signals sampled with the narrow and the wide window functions $W_S(t)$, $W_L(t)$, and by performing the below-described evaluation taking into account the statistical property of spontaneous Brillouin scattering, a Brillouin backscattered signal from the short section SS due to the long pulse probe can be extracted alone. This allows precise measurement of a narrow Brillouin spectrum with a high spatial resolution, thus evaluating a Brillouin frequency shift precisely.

Specifically, a cross-correlation function $C_{SL}(\tau)$ is defined as the following equation (3):

$$C_{SL}(\tau) = \langle \int b_{wS}(t) b_{wL}(t+\tau) dt \rangle \tag{3},$$

where "$\langle \rangle$" stands for ensemble average; $b_{WS}(t)$ and $b_{WL}(t)$, Brillouin backscattered signals sampled with the narrow rectangular window function $W_S(t)$ and the wide rectangular window function $W_L(t)$, respectively; and $\tau$, a delay time. The signals $b_{WS}(t)$ and $b_{WL}(t)$ contain Brillouin backscattered signals from different points and random nose. Note that although the theoretical integral interval (range of t) of the equation (3) is $[-\infty, \infty]$, the practical integral intervals are the support sections $[D, D+T_S]$ and $[D+T_S, D+T_S+T_L]$ for $b_{WS}(t)$ and $b_{WL}(t)$, respectively, where the support section is defined as a section in which a function has non-zero value. Since these sections are finite, a significant solution of the equation can be obtained, i.e., the calculation can be practically performed.

Incidentally, a cross-correlation of random noise is zero from the statistical point of view. Further, a cross-correlation between Brillouin backscattered signals from different points is also zero since Brillouin scattering occurs independently at the different points. Thus, all that needs to be evaluated in calculating the equation (3) is Brillouin back scattered lights from the same point. The following three cases will be now considered for evaluation of the Brillouin backscattered light signals.

Case 1: Brillouin Backscattered Light from the Section at $z>V_g^*(D+T_s)/2$

In this case, since $b_{WS}(t)$ contains no Brillouin backscattered signals, the cross correlation $C_{SL}(\tau)$ is Zero.

Case 2: Brillouin Backscattered Light from the Section Ranging from $z=V_g^*D/2$ to $z>V_g^*(D+T_s)/2$ In this case, the calculation of the equation (3) for the respective optical pulses shown in FIGS. 1A and 1B yields the same absolute values with opposite signs, so that the subtraction doubles the cross-correlation value because inverting one of the signs of two components of the integrand inverts the sign as a whole in calculating the equation (3). Furthermore, the subtraction can leave only cross-correlation value of the Brillouin backscattered signals from the narrow section. Thus, components of a local Brillouin spectrum in the narrow section can be obtained by calculating cross-correlations of the Brillouin backscattered signals frequency down-shifted to the baseband signals.

Figure 3:
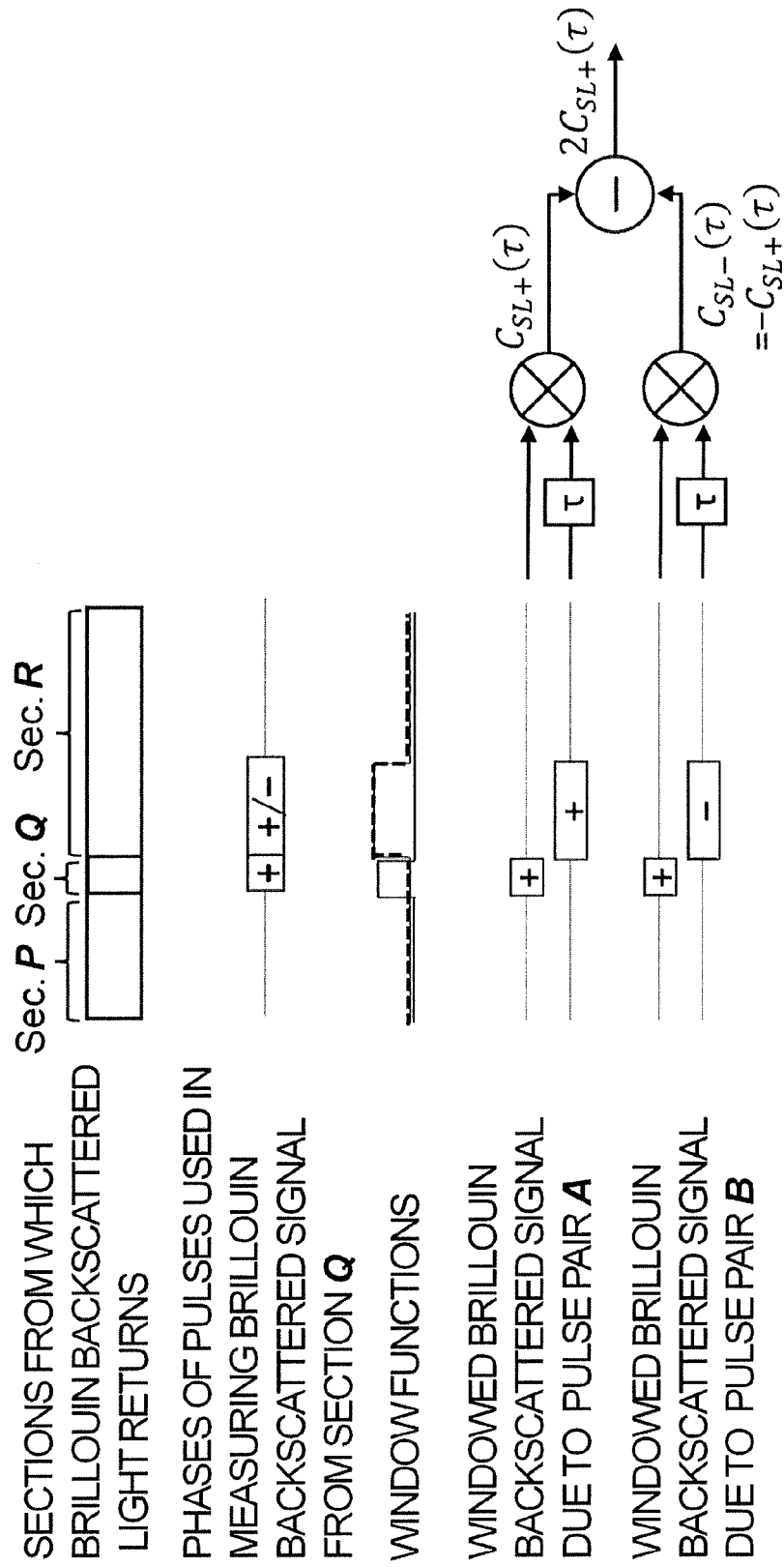
FIG. 3 shows conceptual diagrams for explaining a method of processing Brillouin scattered light signals in the Brillouin scattering measurement method and the Brillouin scattering measurement system according to Embodiment 1.

FIG. 3 shows conceptual diagrams for calculating the cross-correlation of Brillouin backscattered signals from the narrow section SS (indicated by "section Q" in the figure). First, in the left side of the figure, the top shows the sections from which Brillouin backscattered light returns. In the case 2, the cross-correlation of Brillouin backscattered signals from the narrowest section Q among the three sections is calculated. The second diagram from the top conceptually shows the phases of the optical pulse pairs used in calculating the cross-correlation. The third diagram from the top conceptually shows the window functions used in the measurement. The solid line and the broken line schematically indicate the narrow window function $W_S(t)$ and the wide window function $W_L(t)$, respectively. The fourth and fifth diagrams from the top conceptually show Brillouin backscattered signals due to the optical pulse pair A and the optical pulse pair B sampled with the window functions $W_S(t)$ and $W_L(t)$, respectively. Next, the right side diagram schematically illustrates the result of subtraction between convolutions of the windowed signals obtained by using the optical pulse pairs A and B. It will be understood from the right side diagram that the subtraction consequently doubles the cross-correlation $C_{SL+}(\tau)$.

Case 3: Brillouin Backscattered Light from the Section at $z<V_g^*(D+T_s)/2$

In this case, since both $b_{WS}(t)$ and $b_{WL}(t)$ are the Brillouin backscattered signals due to the long optical pulses, the cross-correlation $C_{SL}(\tau)$ contains unwanted components. In order to eliminate the unwanted components from $C_{SL}(\tau)$, the measurements are performed using the two probes: the optical pulse pair A with zero phase shift and the optical pulse pair B with Π phase shift shown in FIGS. 1A and 1B, respectively. Both measurements yield the same $C_{SL}(\tau)$. Thus, subtraction between the two measurement results can remove the unwanted correlation components.

The local Brillouin spectrum can also be evaluated directly using a fast Fourier transformation (FFT) and the convolution theorem of Fourier transform. A reason for using the FFT is for obtaining a signal spectrum from each of short sections of the optical fiber. The signal spectrum can be obtained by resolving one temporal signal into frequency components using the FFT. Brillouin backscattered signals detected through heterodyne detection are sampled with the two window functions $W_S(t)$ and $W_L(t)$ without being transformed to a base band signal. Since the FFT is applied to the signal sampled with the time windows, a local spectrum within the range of each time window is obtained. Thus, shifting the time windows to cover the whole length of the optical fiber allows for obtaining local spectra over the whole optical fiber. Specifically, multiplying the FFT of one windowed data by the complex conjugate of the FFT of the other windowed data determines the FFT of the cross-correlation given by the equation (3), so that the Brillouin backscattered spectrum from a narrow section is extracted. Note that the narrow section here refers to a section corresponding to the duration of the short optical pulse; for example, a short pulse duration of 2 ns corresponds to a section length of 20 cm. Acquiring a large number of spectra of the Brillouin backscattered signals by repeating the technique and calculating ensemble average thereof allow for obtaining a local Brillouin spectrum. While the above overviews the method of obtaining a local Brillouin spectrum, the following describes in detail the method of obtaining the local Brillouin spectrum using the FFT.

Figure 4:
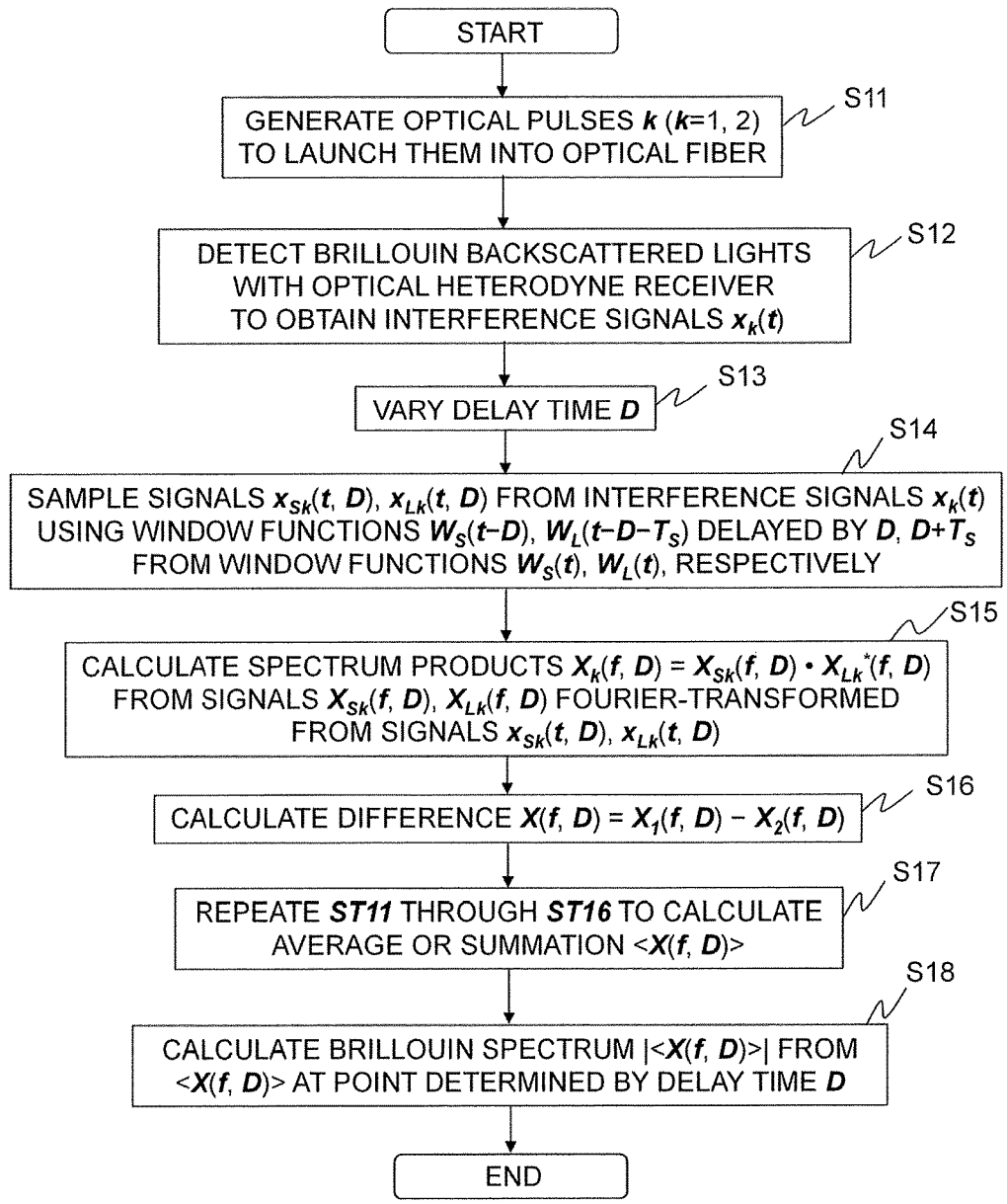
FIG. 4 is a flowchart showing an example of a measurement method used in the Brillouin scattering measurement method and the Brillouin scattering measurement system according to Embodiment 1.

FIG. 4 is a flowchart for explaining the method of obtaining a local Brillouin spectrum using the Fourier transformation. First, the optical pulse pair A and the optical pulse pair B shown in FIGS. 1A and 1B are generated, to be launched into the sensing optical fiber (Step S11). Next, the Brillouin backscattered lights from the optical fiber are detected with an optical heterodyne receiver, to obtain temporal waveforms $x_k(t)$ of the detected interference signals (Step S12). Next, the delay time D is varied (Step S13) to execute the following steps (specifically, to Step S18). Next signals $x_{Sk}(t, D)$ and $x_{Lk}(t, D)$ are sampled from the temporal waveforms $x_k(t)$ of the interference signals using the window functions $W_S(t-D)$ and $W_L(t-D-T_S)$ delayed by D and D+$T_S$ from the window functions $W_S(t)$ and $W_L(t)$, respectively (Step S14). Next, the signals $x_{Sk}(t, D)$ and $x_{Lk}(t, D)$ are Fourier-transformed, to obtain signals $X_{Sk}(f, D)$ and $X_{Lk}(f, D)$. Then, the products $X_k(f, D)$ of $X_{Sk}(f, D)$ and $X_{Lk}^*(f, D)$, which is the complex conjugate of $x_{Lk}(f, D)$, are calculated as $X_k(f, D)=X_{Sk}(f, D) \cdot X_{Lk}^*(f, D)$ (Step S15), where the symbol "*" represents complex conjugate. It should be noted that $X_k(f, D)$ may be calculated as $X_k(f, D)=X_{Sk}^*(f, D) \cdot X_{Lk}(f, D)$. Next, the difference $X(f, D)$ between the products $X_k(f, D)$ is calculated as $X(f, D)=X_1(f, D)-X_2(f, D)$ (Step S16). Next, the above steps from Step S11 through Step S16 are repeated, to calculate the average or summation $<X(f, D)>$ of $X(f, D)$ (Step S17). Finally, the absolute value of $<X(f, D)>$ is calculated, to obtain the Brillouin spectrum $|<X(f, D)>|$ at the point determined by the delay time D (Step S18).

The above method brings about an effect of obtaining a Brillouin scattered spectrum in a single fixed-frequency measurement by mean of a wideband receiver and an FFT. The "wideband reception" technique here merely means no use of a frequency sweeping technique. While the above describes the method of evaluating a local Brillouin spectrum using a Fourier transform without transforming to baseband signals, the evaluation method is not limited to this. The local Brillouin spectrum can also be evaluated by a method using a frequency sweep technique utilizing the baseband signals. The evaluation method using the frequency sweep technique is described below in detail with reference to another flowchart.

Figure 5:
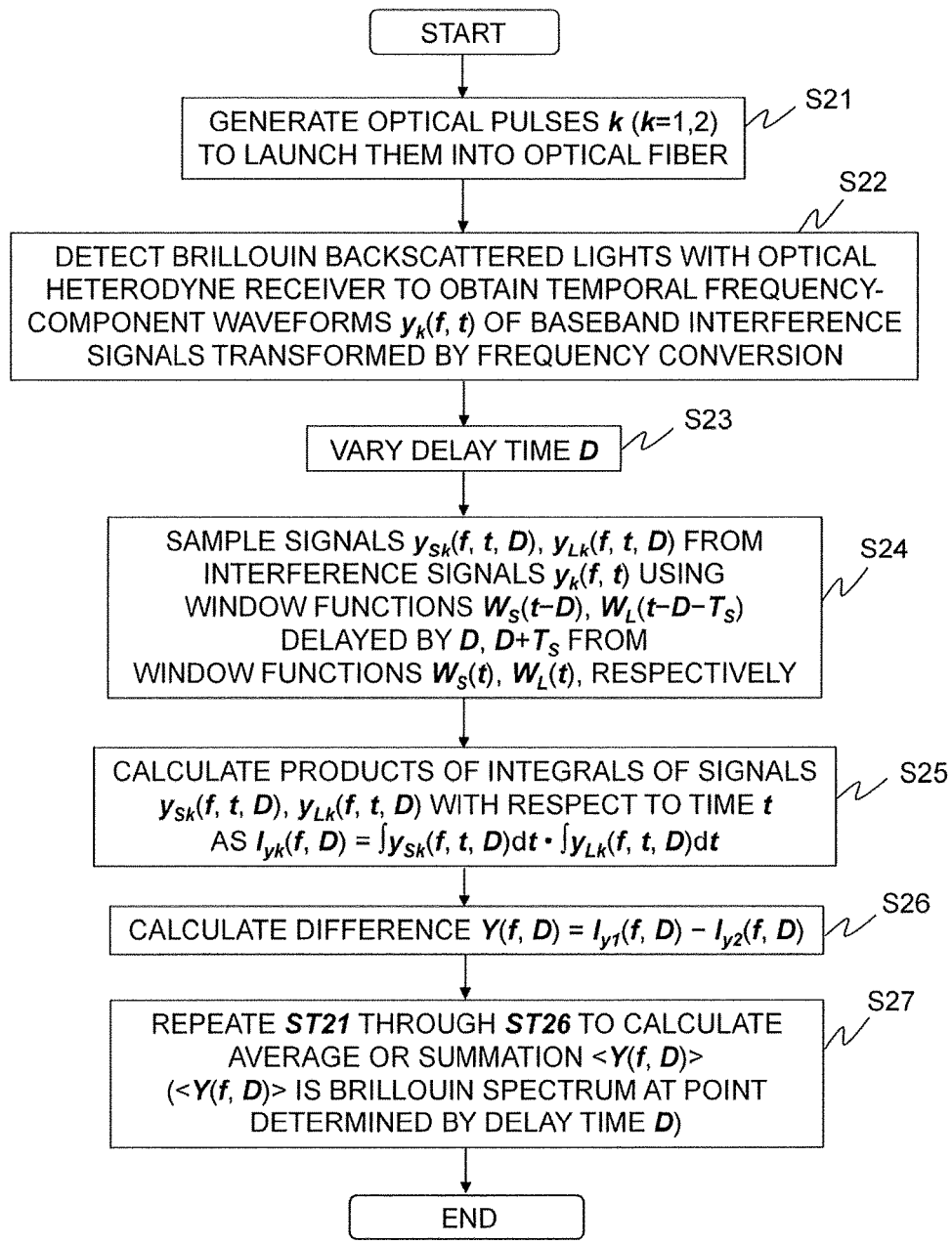
FIG. 5 is a flowchart showing another example of the measurement method used in the Brillouin scattering measurement method and the Brillouin scattering measurement system according to Embodiment 1.

FIG. 5 is the flowchart for explaining the method of obtaining the local Brillouin spectrum using the frequency sweeping. First, the optical pulse pair A and the optical pulse pair B shown in FIGS. 1A and 1B are generated, to be launched into the sensing optical fiber (Step S21). Next, the Brillouin backscattered lights from the optical fiber are detected with an optical heterodyne receiver and transformed to the baseband interference signals by frequency conversion, to obtain frequency-component temporal waveforms $y_k(f, t)$ of the transformed baseband interference signals (Step S22). Next, the delay time D is varied (Step S23) to execute the following steps (specifically, to Step S26). Next, signals $y_{Sk}(f, t, D)$ and $y_{Lk}(f, t, D)$ are sampled from the temporal waveforms $y_k(f, t)$ of the interference signals using the window functions $W_S(t-D)$ and $W_L(t-D-T_S)$ delayed by D and $D+T_S$ from the window functions $W_S(t)$ and $W_L(t)$, respectively (Step S24). Next, the products of the integrals of signals $y_{Sk}(f, t, D)$ and $y_{Lk}(f, t, D)$ with respect to time t are calculated as $I_{Yk}(f, D) = \int y_{Sk}(f, t, D)dt \cdot \int y_{Lk}(f, t, D)dt$ (Step S25). Next, the difference Y(f, D) between the products $I_{Yk}(f, D)$ is calculated as $Y(f, D) = I_{Y1}(f, D) - I_{Y2}(f, D)$ (Step S26). Finally, the above steps from Step ST21 through Step ST26 are repeated, to calculate the average or summation <Y(f, D)> of Y(f, D) (Step S27). The <Y(f, D)> is the Brillouin spectrum at the point determined by the delay time D.

In the above described method shown in FIG. 5, while the measurement is performed multiple times with the frequency being varied stepwise, detection by the photodetector is only needed in the measurement, thus bringing about an effect of facilitating implementation of the measurement.

Figure 6:
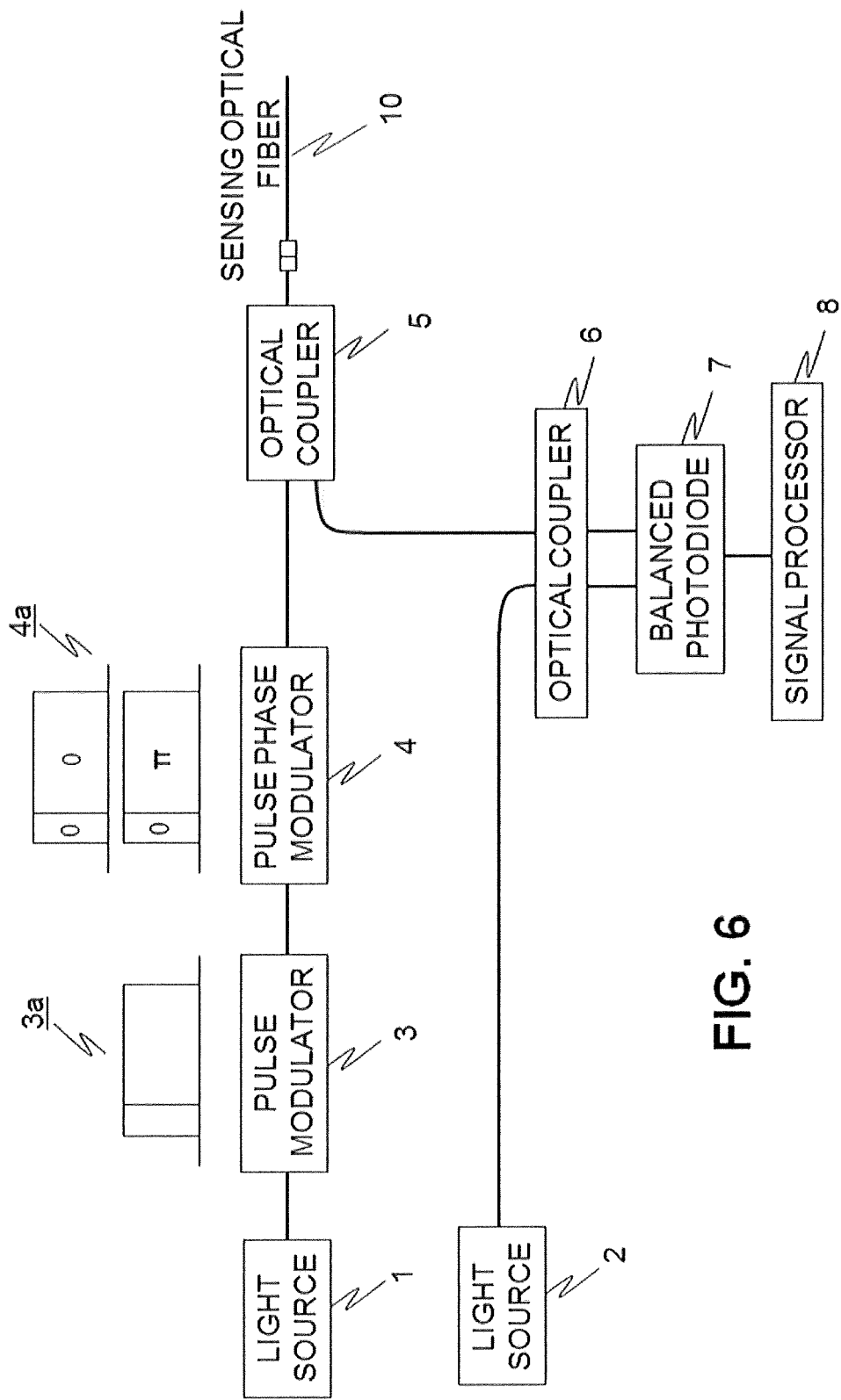
FIG. 6 is a diagram showing an example of a basic configuration of the Brillouin scattering measurement system according to Embodiment 1.

Now, a basic configuration of an actual Brillouin backscattering measurement system is described with reference to FIG. 6. FIG. 6 is a diagram for explaining an example of a system configuration basic to the Brillouin backscattering measurement method according to Embodiment 1. Specifically, the basic configuration of the actual measurement system is as follows: A pulse modulator 3 modulates the laser light of a light source 1 to an optical pulse pair 3a that is a combination of a short pulse and a long pulse to be launched into an optical fiber; A pulse phase modulator 4 phase-modulates the generated pulse pair 3a to two optical pulse pairs 4a to have two types of phase modulation characteristics (no phase-shift modulation for the two short pulses, and no phase-shift modulation for one of the two long pulse and Π phase-shift modulation for the other long pulse); The phase-modulated optical pulse pairs 4a are launched into a single-mode optical fiber (SMF) 10, which is a sensing optical fiber, through an optical coupler 5; Brillouin backscattered lights produced in the optical fiber by the launched optical pulse pairs 4a return to the optical coupler 5 and are diverted to a path different from the path that the launched optical pulse pairs passed through; The backscattered lights diverted by the optical coupler 5 are input into another optical coupler 6 along with a light emitted from a light source 2 that is the same type of the light source 1, and then these two kinds of lights output from the optical coupler 6 are individually input to a balanced photodiode 7; After that, a single kind of signals output from the balanced photodiode 7 is processed by a signal processor 8. It should be noted that while the above system is configured to have the two light sources 1 and 2, a measurement system configuration is not limited to this but may have only one light source. Except for splitting the light emitted from the one light source into two different paths by an optical coupler or the like disposed on the output side of the light source, the configuration in this case is the same as the basic configuration described above.

Since achievement of a target spatial resolution was demonstrated using an actual experimental setup having the basic configuration, details of the experimental setup and experimental results are described below with reference to FIGS. 7 through 11.

Figure 7A:
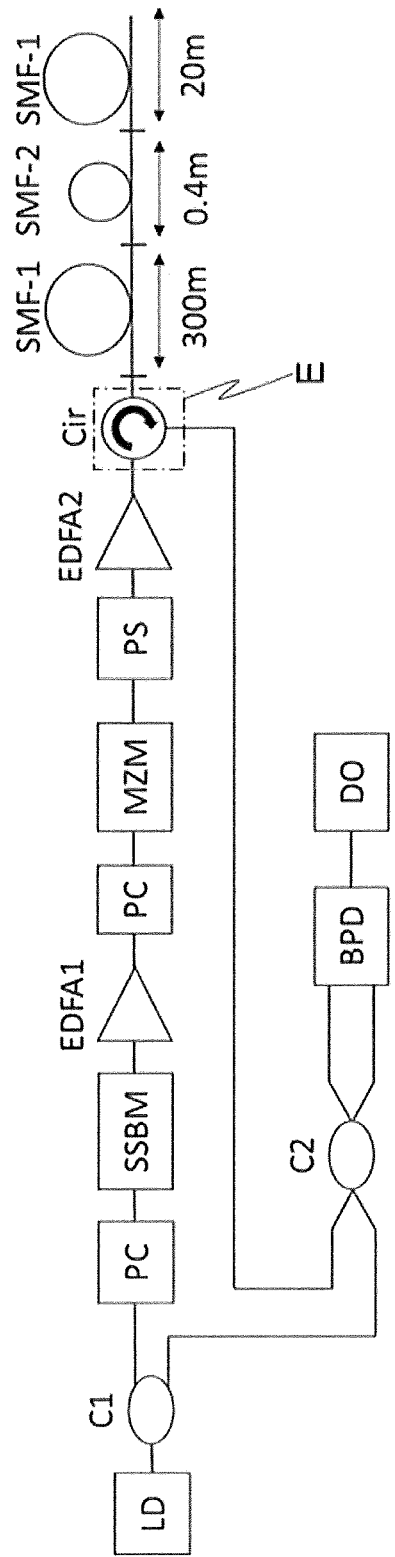
FIGS. 7A and 7B show an example of the Brillouin scattering measurement system according to Embodiment 1.
Figure 7B:
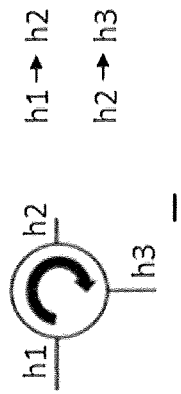

Firstly, the experimental setup is described in detail with reference to FIGS. 7A and 7B. FIGS. 7A and 7B shows a block diagram of the experimental setup used for obtaining a local Brillouin spectrum across the optical fiber. In the figure, LD indicates a semiconductor laser (laser diode); C1 and C2, optical couplers; PC, a polarization controller; SSBM, a single-sideband carrier-suppressed modulator; EDFA1 and EDFA2, erbium-doped fiber amplifiers; MZM, a Mach-Zehnder modulator; PS, a polarization scrambler; Cir, an optical circulator; SMF-1 and SMF-2, single mode optical fibers; BPD, a balanced photodiode; DO, a digital oscilloscope (see FIG. 7A). The polarization scrambler here was used for averaging polarization fluctuations.

In order to describe the function of the optical circulator, the portion indicated by the symbol E in FIG. 7A is enlargedly shown in FIG. 7B. The laser light from the laser diode LD passes through SSBM, EDFA2 and the like to be modulated to the optical pulse probes. The optical pulse probes enter into a port h1 of the optical circulator Cir and then are launched from a port h2 into a sensing fiber that is composed of the single mode optical fibers SMF-1, SMF-2, and SMF-1. Brillouin backscattered lights produced in the single mode optical fibers by the launched light return to the port h2 and are diverted not toward the port h1 but toward a port h3 of the optical circulator Cir. Then, the backscattered lights are input into the optical coupler C2 along with the reference light split by the optical coupler C1.

The durations of the optical pulse probes used in the experimental setup shown in FIGS. 7A and 7B were $T_S=2$ ns and $T_L=32$ ns, respectively. The duration $T_L$ was determined taking account of the phonon lifetime. Moreover, the experimental setup is characterized by its signal processing in addition to the durations of the optical pulse probes. In order to adjust the beat frequency between the Brillouin backscattered lights and the reference light to about half a maximum frequency detectable for the balanced photodiode BPD, the probe light of 1.55 μm wavelength was upshifted by the frequency $f_M$ by the single-sideband carrier suppressed modulator SSBM. The specific value of the upshifted frequency $f_M$ was about 10.080 GHz. This allows for simultaneously detecting all frequency components of the Brillouin scattered lights. The detected signals are sampled by the digital oscilloscope DO and processed in frequency domain in accordance with the foregoing steps by a personal computer.

In addition, the Brillouin backscattered signals were acquired 50,000 times (the acquisition counts may be two or more in principle) for each of the two pulse probes (the optical pulse pair A and the optical pulse pair B) shown in FIGS. 1A and 1B. The optical fiber under test was composed of the two optical fibers SMF-1 of 300 m and 20 m long, and the optical fiber SMF-2 of 40 cm long. The optical fiber SMF-2 used in this case had a Brillouin frequency shift BFS different by about 40 MHz from that of the optical fibers SMF-1, and was joined by fusion splicing between the two optical fibers SMF-1 (see FIG. 7A).

Figure 8:
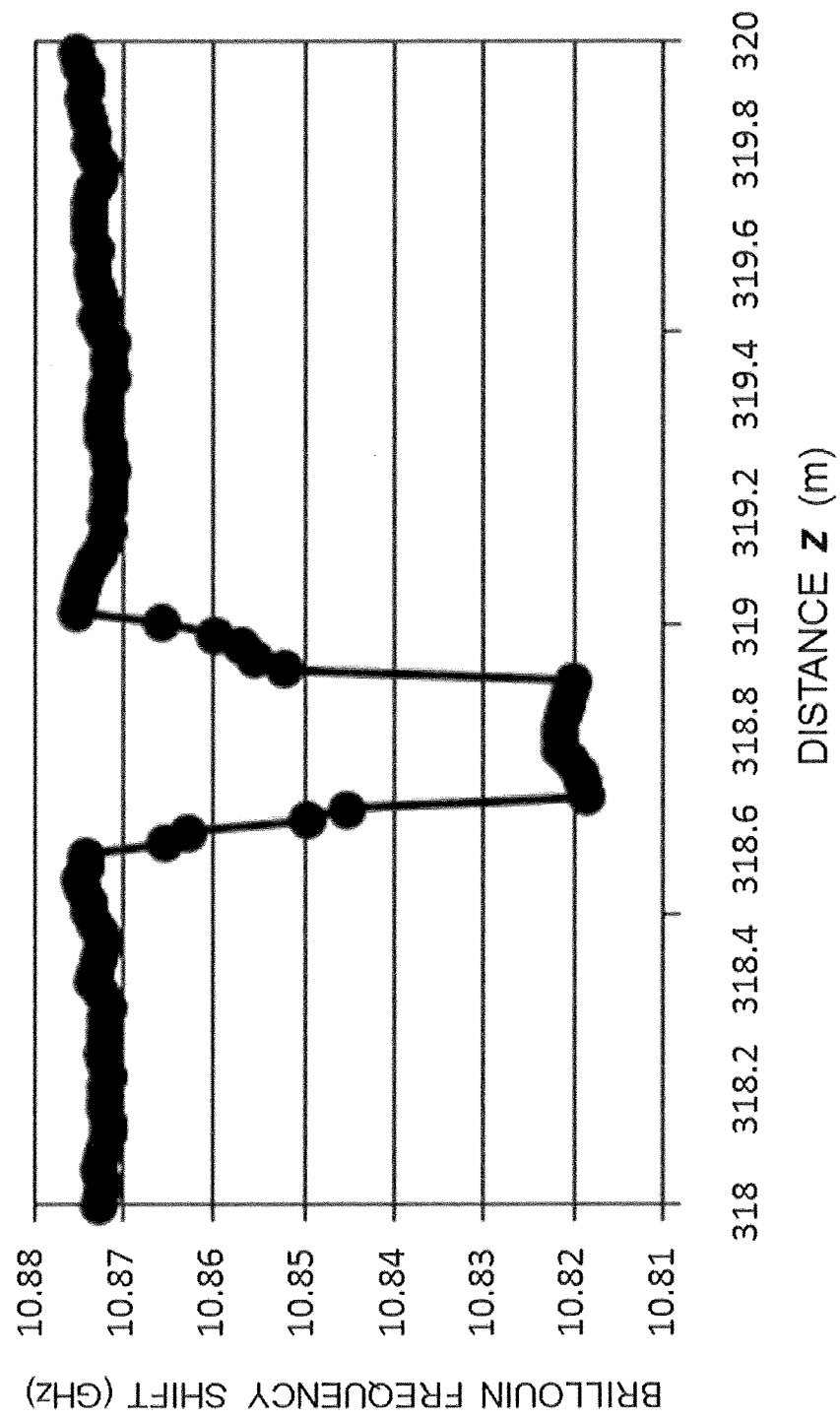
FIG. 8 is a graph showing an example of an experimental result of a Brillouin frequency shift measured with the Brillouin scattering measurement system of FIGS. 7A and 7B.

Next, experimental results using the experimental setup shown in FIGS. 7A and 7B are described with reference to FIGS. 8 through 11. First, FIG. 8 shows a measurement result of Brillouin frequency shifts BFS of the optical fiber SMF-2 and the two optical fibers SMF-1 joined to SMF-2. The horizontal axis represents in meter a distance from the incident end of the longer one of the two optical fibers SMF-1 shown in FIGS. 7A and 7B. The vertical axis represents the Brillouin frequency shifts BFS measured in GHz. The measurement results demonstrated that variation of the Brillouin frequency shifts BFS was correctly measured in a region across the optical fiber SMF-2 and a spatial resolution of 20 cm was achieved.

Figure 9:
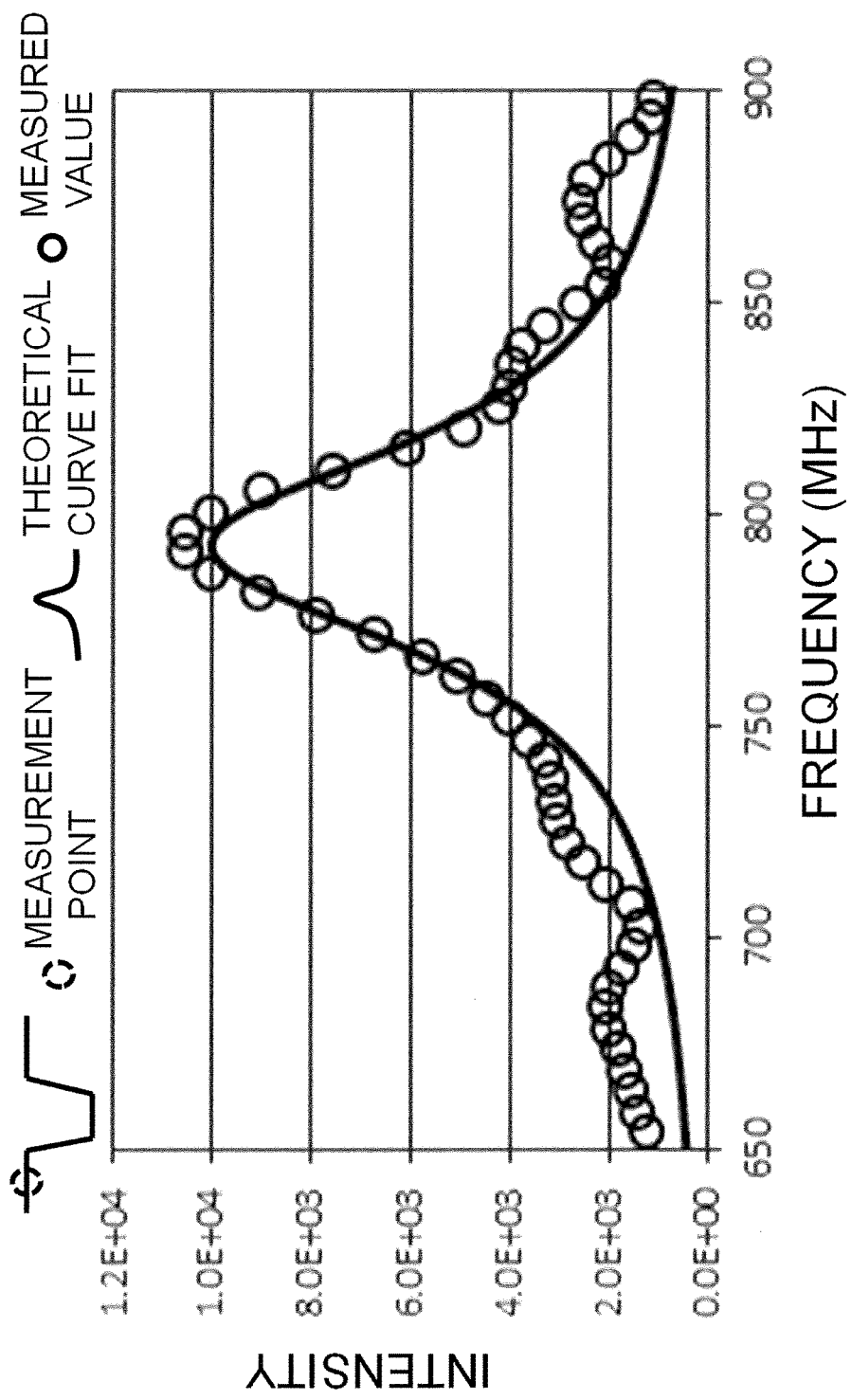
FIG. 9 is a graph showing an example of a Brillouin spectrum of a sensing optical fiber measured with the Brillouin scattering measurement system of FIGS. 7A and 7B.
Figure 10:
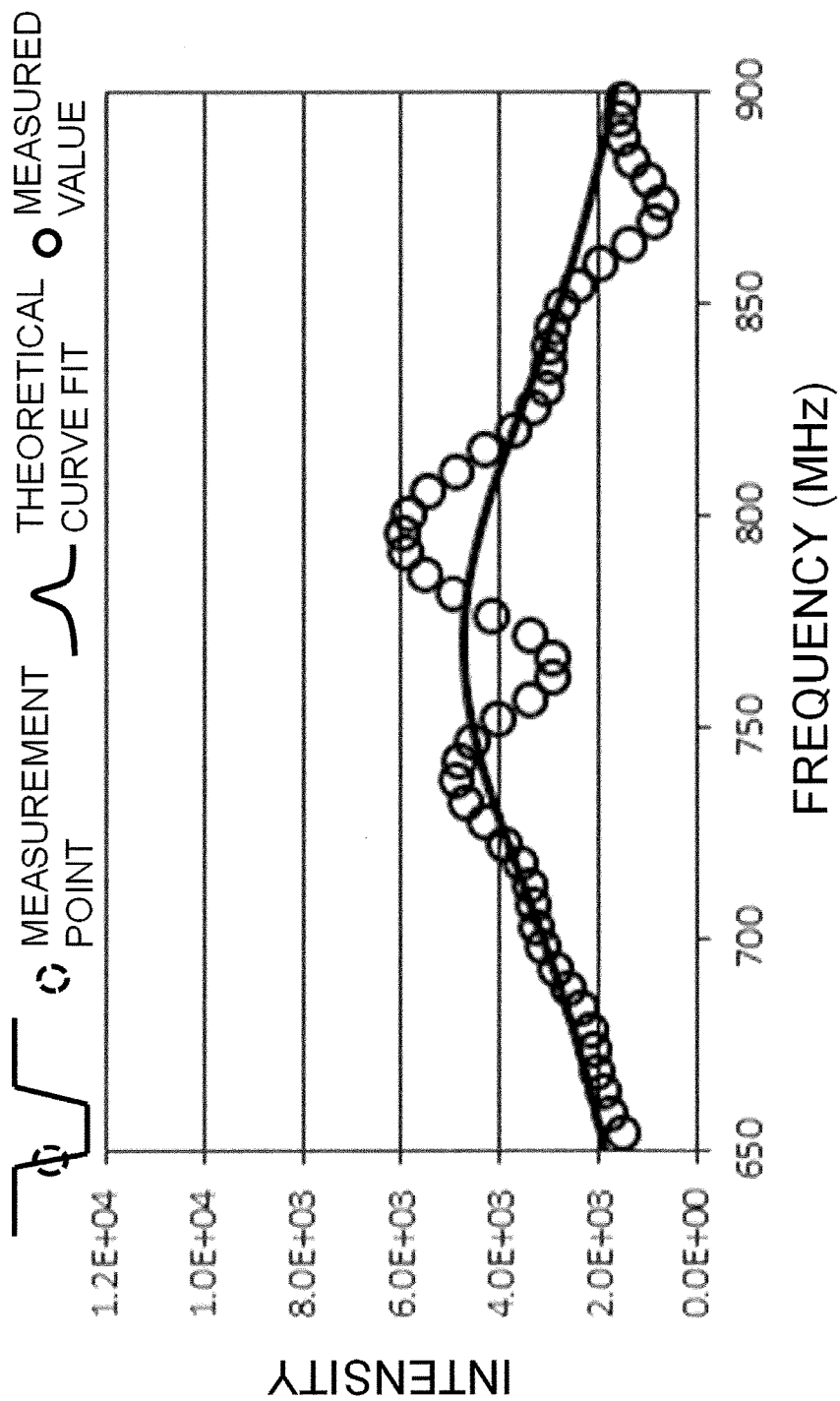
FIG. 10 is a graph showing another example of the Brillouin spectrum of the sensing optical fiber measured with the Brillouin scattering measurement system of FIGS. 7A and 7B.
Figure 11:
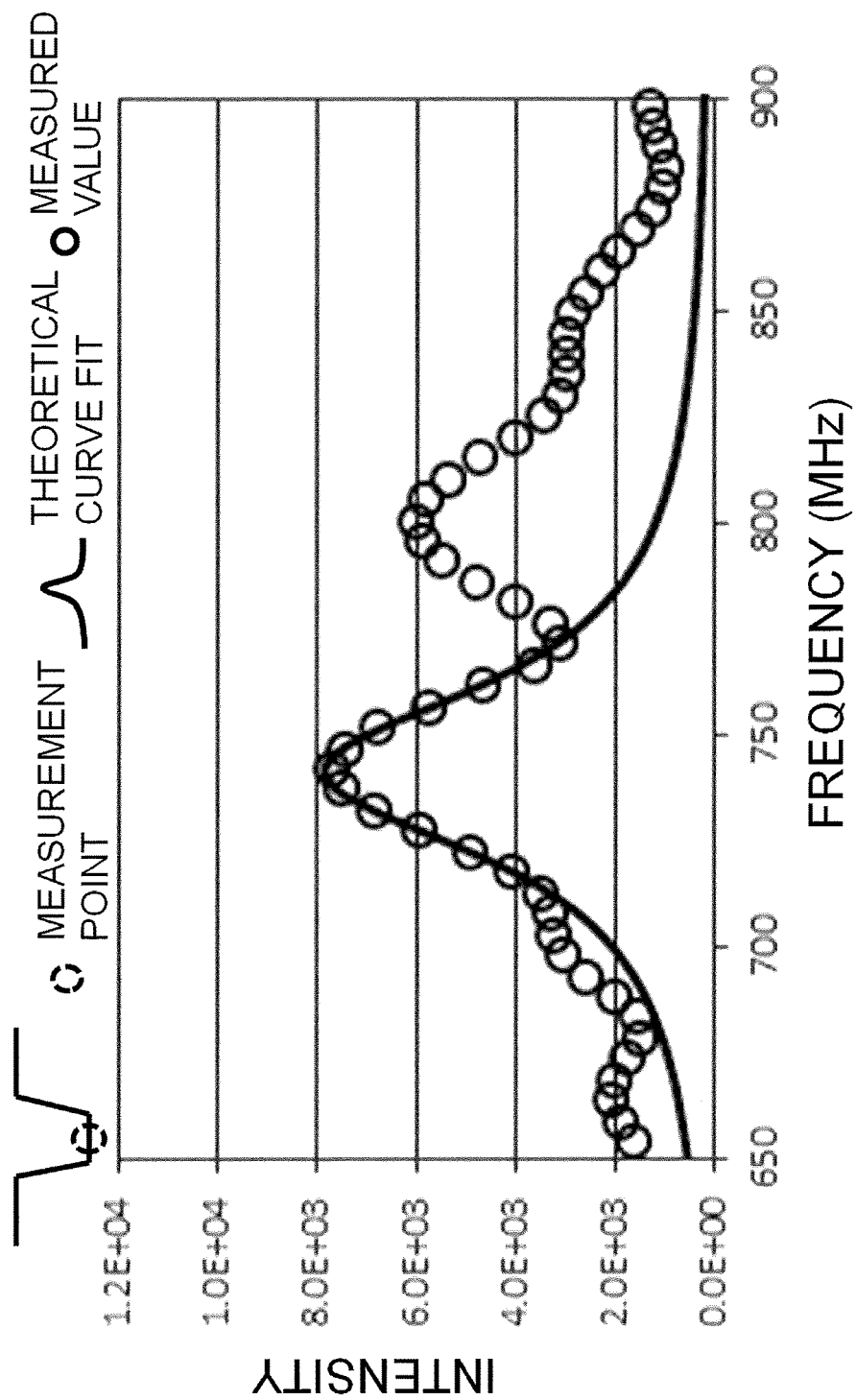
FIG. 11 is a graph showing still another example of the Brillouin spectrum of the sensing optical fiber measured with the Brillouin scattering measurement system of FIGS. 7A and 7B.

FIGS. 9 through 11 show measurement results (indicated by the open circles) of and theoretical curve fits (indicated by the solid line) to Brillouin spectra at and near the optical fiber SMF-2. In any graphs, the horizontal axis represents the frequency difference between the frequency of the detected beat-signal and the offset reference frequency of $f_M$=10.080 GHz, and the vertical axis represents intensity of the signal in arbitrary scale. The dotted circle in the upper left of each graph indicates the measurement point in relation to FIG. 8.

FIG. 9 shows an experimental result of and a theoretical curve fit to the Brillouin spectrum at the distance z=318.00 m in the optical fibers SMF-1. The theoretical curve fit (Lorentzian curve fit) agreed well with the measurement values around the peak of the spectrum, demonstrating that the measurement result is correct.

FIG. 10 shows an experimental result of and a theoretical curve fit to the Brillouin spectrum at the distance z=318.66 m including the splice of the optical fibers SMF-1 and SMF-2. It is observed that there is two spectrum peaks at 793 MHz and 742 MHz.

FIG. 11 shows a measurement result of and a theoretical curve fit to the Brillouin spectrum at the distance z=318.80 m in the optical fiber SMF-2. The spectrum peak at 742 MHz agreed with the Brillouin shift frequency BSF due to the optical fiber SMF-2. Note that the peak near 800 MHz is due to the Brillouin spectrum of the optical fiber SMF-1. It is considered that this is caused by lightwave leakage from the Mach-Zehnder modulator MZM or imbalance in intensity between the two optical pulse pairs shown in FIGS. 1A and 1B.

Figure 12:
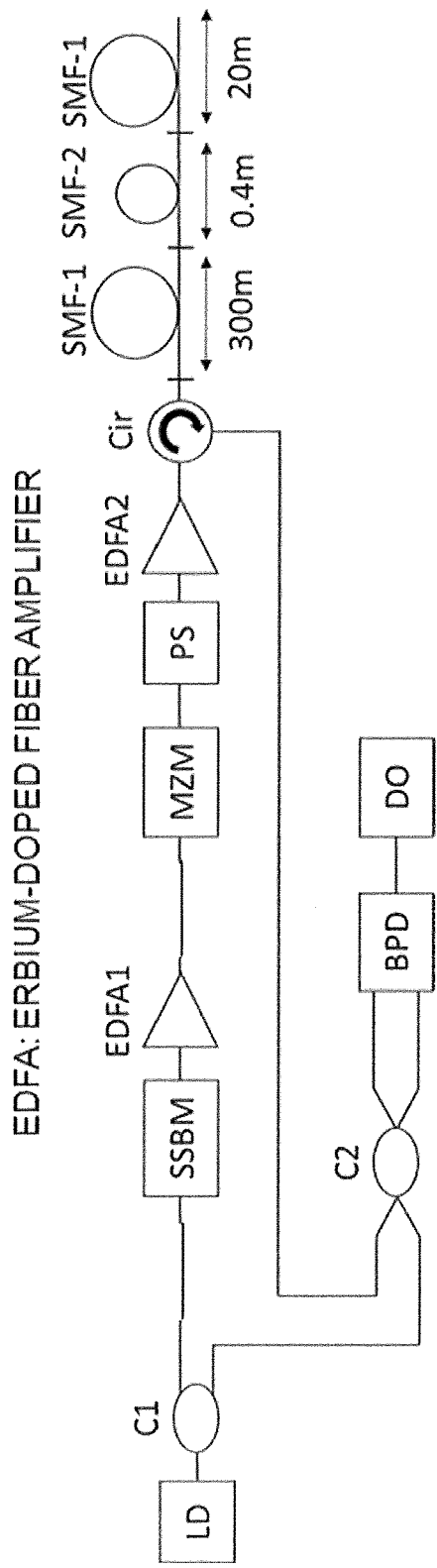
FIG. 12 is a diagram showing another example of the Brillouin scattering measurement system according to Embodiment 1.

In addition, while the measurement results shown in FIGS. 8 through 11 were obtained using the experimental setup of FIGS. 7A and 7B as described above, a measurement system is not limited to the experimental setup. As shown in FIG. 12, a measurement system without the two polarization controllers PC in the experimental setup of FIGS. 7A and 7B can also bring about a similar effect as with the case of using the experimental setup shown in FIGS. 7A and 7B.

Embodiment 2

Figure 13:
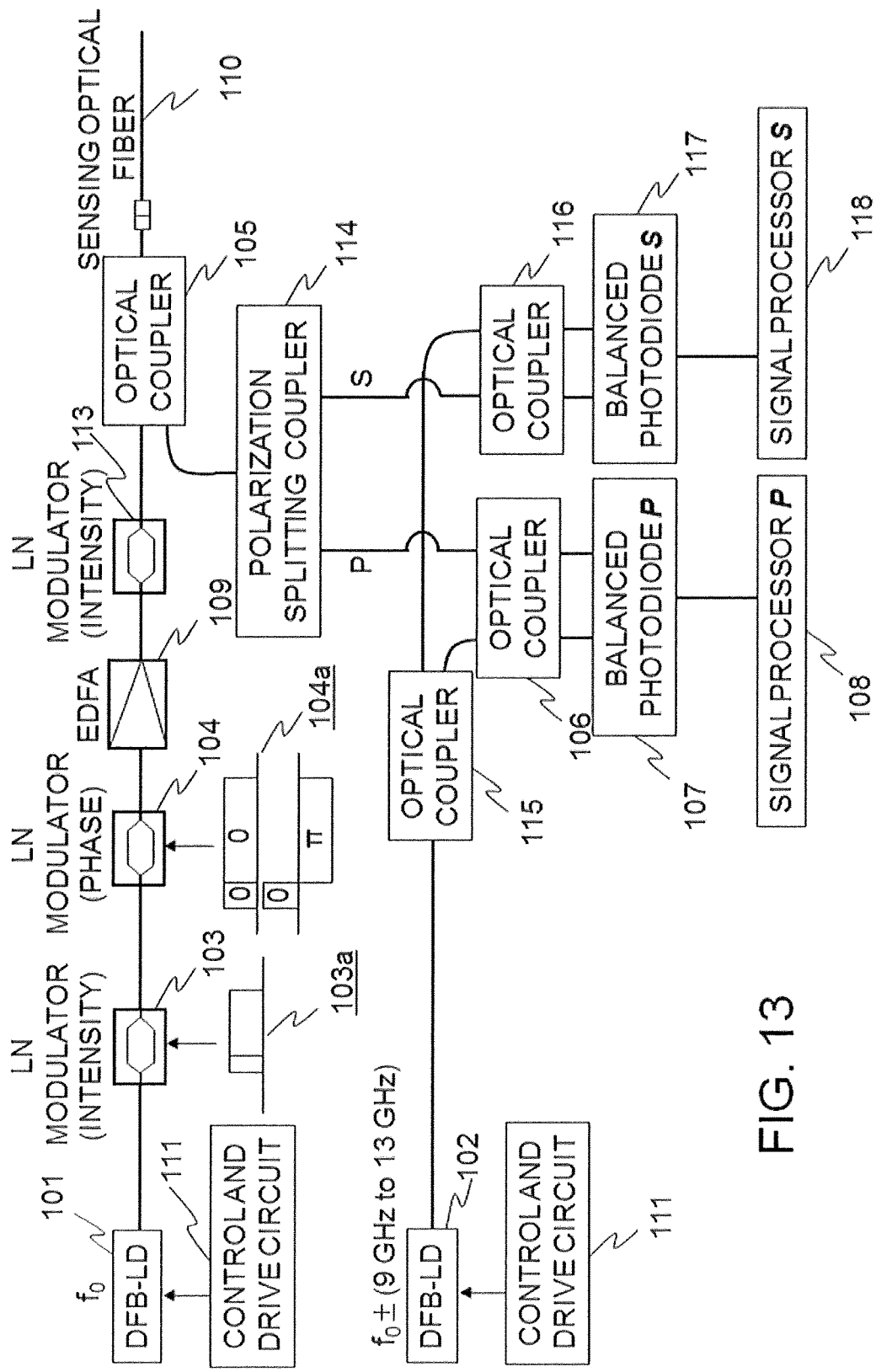
FIG. 13 is a diagram showing a configuration of a Brillouin scattering measurement system according to Embodiment 2 of the present invention.

Another configuration of the Brillouin backscattered measurement system that implements the basic configuration and is different from the experimental setup shown in FIGS. 7A and 7B is described in detail with reference to FIG. 13. A laser light emitted from a distributed feedback laser diode (DFB-LD, oscillation frequency $f_0$) 101 shown in upper portion of the figure is intensity-modulated to an optical pulse pair 103 by a first lithium niobate (LN) modulator 103, and then phase-modulated to two types of optical pulse pairs 104 by a second lithium niobate (LN) modulator 104 and amplified in power by an erbium-doped fiber amplifier (EDFA) 109. After that the amplified optical pulse pairs are entered into a third lithium niobate (LN) modulator 113 to be adjusted again in its intensity and then launched into a single-mode optical fiber (SMF), which is a sensing optical fiber, through an optical coupler 105. The backscattered lights produced in the optical fiber by the launched optical pulse pairs 104a return to the optical coupler 105. The return lights output from the optical coupler 105 are input to a polarization splitting coupler 114 to be split into a P-wave (oscillating parallel to the incident plane) and a S-wave (oscillating perpendicular to the incident plane). These two types of lightwaves output from the polarization splitting coupler are entered into a third optical coupler 106 and a fourth optical coupler 116 along with reference laser lights split by another optical coupler 115 from the laser light emitted from distributed feedback laser diode (DFB-LD, oscillation frequency $f_0\pm$(9 GHz to 13 GHz)) 102 shown in the lower portion of the figure, respectively. The respective lights from the optical couplers 106, 116 are input into a balanced photodiode P (107) and a balanced photodiode S (117). Then, the respective outputs of the balanced photodiodes P, S are independently processed by a signal processor P (108) and a signal processor S (118). Note that on and off of pumping and the wavelengths of the laser lights of both laser diodes DFB-LDs (101, 102) are controlled by control and drive circuits 111.

The present technique (polarization diversity technique) can further enhance photosensitivity in comparison to the technique using the polarization scrambler. Moreover, amplitude fluctuations of the detected signals can be suppressed to a minimum, thereby enhancing the measurement accuracy.

It should be noted that each embodiment of the present invention may be freely combined, or may be appropriately modified or omitted within the spirit and the scope of the invention. For example, while the above describes the case of the phase combinations of the optical pulse pairs being 0, 0 and 0, Π, the phase combination is not limited to this. The same discussion holds true for a case of the phase combinations being Π, Π and Π, 0, or the like.

What is claimed is:

1. A Brillouin scattering measurement method for measuring a physical quantity from frequency shift variation of a Brillouin backscattered light, comprising:
   generating two types of optical pulse pairs each composed of two pulses of different durations, one of the pairs having pulses of the same phase and the other pair having pluses of different phases;
   detecting, with an optical heterodyne receiver, Brillouin backscattered lights respectively produced by launching the generated two types of optical pulse pairs into one end of an optical fiber;
   sampling the signals detected by the optical heterodyne receiver, with two window functions whose time widths are equal to respective pulse durations of the optical pulse pairs and whose delay time is variable;
   transforming the respective signals sampled with the two window functions, with a predetermined transformation;
   calculating products of the two signals, which respectively correspond to the two types of optical pulse pairs, transformed with the predetermined transformation; and
   subtracting the calculated products from each other, thereby to obtain a spectrum of the Brillouin scattered light.

2. The Brillouin scattering measurement method of claim 1, wherein the subtraction between each product is performed two times or more, to obtain the Brillouin backscattered spectrum from an average or a summation of the plurality of subtractions between the products.

3. The Brillouin scattering measurement method of claim 1, wherein
   the predetermined transformation is a Fourier transformation, and wherein
   the respective signals detected with the optical heterodyne receiver are directly sampled with the two window functions, and one of the signals sampled with the two window functions is transformed with the Fourier transformation and the other is transformed with the complex-conjugate of the Fourier transformation.

4. The Brillouin scattering measurement method of claim 1, wherein
the predetermined transformation is a frequency conversion and an integral transformation with respect of time, and wherein
the respective signals detected with the optical heterodyne receiver are frequency-shift-converted to baseband signals; and then the respective baseband signals are sampled with the two windows functions, and the respective sampled signals are transformed with the integral transformation to signals.

5. The Brillouin scattering measurement method of claim 1, wherein the durations of the pulses of the optical pulse pairs and the interval between the pulses of each optical pulse pair are determined taking account of a phonon lifetime.

6. The Brillouin scattering measurement method of claim 1, wherein the duration of one of the pulse of each optical pulse pair is shorter and the duration of the other is longer than a phonon lifetime.

7. The Brillouin scattering measurement method of claim 1, wherein the intervals between the pulses of each optical pulse pair are zero or shorter than a phonon lifetime.

8. The Brillouin scattering measurement method of claim 1, wherein the phase difference between the pulses of the different-phase optical pulse pair is Π.

9. The Brillouin scattering measurement method of claim 1, wherein order of launching the pulses of each optical pulse pair into the optical fiber is independent of the durations of the optical pulses: either the longer or the shorter pulse may be launched first.

10. A Brillouin scattering measurement system for measuring a physical quantity from frequency shift variation of a Brillouin backscattered light, comprising:
a light source, or a first light source and a second light source different from the first light source;
a pulse modulator for modulating a light emitted from the light source or any one of the two light sources to an optical pulse pair each composed of two pulses having different durations;
a pulse phase modulator for modulating the optical pulse pairs modulated by the pulse modulator to two types of optical pulse pairs, one of the optical pulse pairs having the pulses of the same phase and the other pair having the pulses of different phases;
a first optical coupler for receiving the two types of optical pulse pairs to launch the received optical pulse pairs into one end of an optical fiber through an input path of the coupler and for receiving Brillouin backscattered lights produced in the optical fiber, to output the backscattered lights through a path different from the input path;
a second optical coupler for receiving the Brillouin backscattered lights output from the first optical fiber along with the light emitted from the light source or a light emitted from the other of the first or the second light sources, to output the two kinds of lights individually;
a balanced photodiode for individually receiving the two kinds of lights output from the second optical coupler, to output one kind of signals after adjusting balance of the input signals; and
a signal processor for processing the signal output from the balanced photodiode, wherein
the signals of the Brillouin backscattered lights produced by the two types of optical pulse pairs are individually processed with the signal processor in such a way that the signals received by the balanced photodiode are sampled with two window functions whose time widths are equal to the respective durations of the pulses of the optical pulse pairs and whose delay time is variable; and the two windowed signals are transformed with a predetermined transformation; and the transformed signals, which respectively correspond to the two types of optical pulse pairs, are multiplied by each other; and then the calculated products are subtracted from each other, thereby to obtain a spectrum of the Brillouin backscattered light.

11. The Brillouin scattering measurement system of claim 10, wherein the subtraction between each product is performed two times or more, thereby to obtain the Brillouin backscattered spectrum from an average or a summation of the plurality of subtractions between the products.

12. The Brillouin scattering measurement system of claim 10, wherein
the light source or both two light sources is/are distributed feedback laser diode/diodes, the pulse modulator is a lithium niobate intensity modulator, and the pulse phase modulator is a lithium niobate phase modulator, the Brillouin scattering measurement system further comprising:
a plurality of the second optical couplers;
a plurality of the balanced photodiodes;
a plurality of the signal processors;
an erbium-doped fiber amplifier for amplifying the phase modulated optical pulse pairs, to output the amplified optical pulse pairs toward the first optical coupler;
a third optical coupler for splitting the input light emitted from the light source or the other of the two light sources into two lights, to output the respective split lights to the second optical couplers; and
a polarization splitting coupler for splitting the light output from the first optical coupler into a polarized light oscillating parallel to the incident plane and a polarized light oscillating perpendicular to the incident plane, to output the respective polarized lights to the second optical couplers, thereby to obtain a spectrum of the Brillouin backscattered light.

* * * * *